(12) United States Patent
Kim et al.

(10) Patent No.: US 6,914,285 B2
(45) Date of Patent: Jul. 5, 2005

(54) SEMICONDUCTOR DEVICE HAVING DIFFERENT THICKNESS GATE OXIDES

(75) Inventors: Jae-Hoon Kim, Suwon (KR); Jong-Hyun Choi, Suwon (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/369,625

(22) Filed: Feb. 21, 2003

(65) Prior Publication Data

US 2004/0061158 A1 Apr. 1, 2004

(30) Foreign Application Priority Data

Sep. 27, 2002 (KR) .................. 10-2002-0058674

(51) Int. Cl.$^7$ .................. H01L 27/108; H01L 29/76; H01L 29/94
(52) U.S. Cl. .................. 257/296; 257/410; 257/411
(58) Field of Search .................. 257/296, 410, 257/411, 369; 348/310

(56) References Cited

U.S. PATENT DOCUMENTS 6,635,934 B2 * 10/2003 Hidaka .................. 257/369
6,670,990 B1 * 12/2003 Kochi et al. .................. 348/310

FOREIGN PATENT DOCUMENTS

| JP | 11283369 | 10/1999 |
| KR | 20010050100 | 6/2001 |

* cited by examiner

*Primary Examiner*—Steven Loke
(74) *Attorney, Agent, or Firm*—Harness, Dickey & Pierce, P.L.C.

(57) ABSTRACT

A peripheral circuit of a semiconductor device, including a circuit further including a plurality of electronic components using same source voltage, wherein the plurality of electronic components have gate oxides of different thicknesses. The plurality of electronic components may be for a delay chain, a directional delay and a power switch.

2 Claims, 3 Drawing Sheets

202, 203, 206

SEMICONDUCTOR DEVICE HAVING DIFFERENT THICKNESS GATE OXIDES

This U.S. non-provisional patent application claims priority under 35 U.S.C. § 119 of Korean Patent Application 2002-58674 filed on Sep. 27, 2002, the entire contents of which is hereby incorporated by reference.

FIELD OF THE INVENTION

The present invention relates to a semiconductor device, and more particularly, to a semiconductor device including transistors connected to the same voltage source that have different gate oxide thicknesses.

DESCRIPTION OF THE RELATED ART

In general, semiconductor memory devices are classified into static random access memory (SRAM) and dynamic random access memory (DRAM). A unit memory cell of a DRAM can be formed more simply than a unit memory cell of an SRAM, thus the DRAM has the advantage of high density. To increase the speed of a read/write data operation, a DRAM can be operated in synchronism with a system clock of a computer system on which the DRAM is mounted.

Such random access memory devices operating in synchronization with the system clock are termed synchronous dynamic random access memory (S-DRAM). An S-DRAM synchronizes to the system clock so as to receive a command for a row active operation and a data read/write operation. Also, various command signals of a S-DRAM may be input and output synchronously to the system clock. The input/output may be performed at a rising edge or a falling edge of the system clock. In designing a S-DRAM, whether an operation is to be performed at the rising edge or the falling edge may be decided in advance.

In an S-DRAM, an internal circuit can be divided into a synchronous part and an asynchronous part. For instance, operations of row address decoding, activation of a selected word line and a bit line sensing, etc. do not synchronize to the clock, while data input/output operations of a semiconductor memory device do synchronize to the clock. The synchronous part may be subdivided into a portion in synchronism with an externally applied system clock and a portion in synchronism with an internal clock.

SUMMARY OF THE INVENTION

Exemplary embodiments of the present invention provide a semiconductor device which reduces layout area by using MOS transistors having different gate oxides thickness on a peripheral circuit region of the semiconductor memory device.

In another exemplary embodiment, the present invention is directed to a peripheral circuit of a semiconductor device, including a circuit including a plurality of electronic components using same source voltage, where the plurality of electronic components have gate oxides of different thicknesses.

In an exemplary embodiment of the present invention, the semiconductor device includes a delay chain including a MOS transistor and at least one MOS capacitor. The MOS transistor is driven by a voltage level of a first power and the MOS capacitor is driven by the output signal of the MOS transistor. The gate oxide of the MOS transistor has a structure thicker than the gate oxides of the plurality of MOS capacitors. Thus, the thickness of gate oxides of the MOS transistor and the MOS capacitors may control the delay time of the delay chain.

In another exemplary embodiment of the present invention, the circuit is a delay chain including a MOS transistor and a plurality of MOS capacitors, where a gate oxide of the MOS transistor and gate oxides of the plurality of MOS capacitors have different thicknesses for controlling a delay time.

In another exemplary embodiment of the present invention, the MOS transistor is driven by a first power and the plurality of MOS capacitors are driven by an output signal of the MOS transistor, the gate oxide of the MOS transistor being thicker than gate oxides of the plurality of MOS capacitors.

Another exemplary embodiment of the present invention provides a semiconductor device including a directional delay which includes a plurality of transistors using the same source voltage.

In another exemplary embodiment of the present invention, the circuit is a directional delay including a plurality of transistors having different gate oxide thicknesses.

The plurality of delays may include a first delay including a PMOS transistor and a NMOS transistor connected in series between a first voltage and a ground; a second delay including a PMOS transistor and a NMOS transistor connected in series between the first voltage and the ground, wherein the gates of the two transistors are connected in common to an output terminal of the first delay; and a third delay including a PMOS transistor and a NMOS transistor connected in series between the first voltage and the ground, wherein the gates of the two transistors are connected in common to an output terminal of the second delay.

In another exemplary embodiment of the present invention, the plurality of transistors include a first PMOS transistor and a first NMOS transistor connected in series between a voltage and a ground, the first PMOS transistor and the first NMOS transistor connected to a common first input terminal and the first PMOS transistor and the first NMOS transistor forming a common first output terminal; a second PMOS transistor and a second NMOS transistor connected in series between the voltage and the ground, the second PMOS transistor and the second NMOS transistor connected to the common first output terminal and the second PMOS transistor and the second NMOS transistor forming a common second output terminal; and a third PMOS transistor and a third NMOS transistor connected in series between the voltage and the ground, the third NMOS transistor and the third PMOS transistor connected to the common second output terminal.

In another exemplary embodiment, the present invention provides a semiconductor device that uses one or more power switches to reduce its size. The power switches includes MOS transistors having different gate oxide thicknesses.

In another exemplary embodiment of the present invention, the first NMOS transistor and the first PMOS form a first delay, the first NMOS transistor having a gate oxide thicker than gate oxide of the first PMOS transistor; the second PMOS transistor and the second NMOS transistor form a second delay, the second PMOS transistor having a gate oxide thicker than gate oxide of second NMOS transistor; and the third NMOS transistor and the third PMOS transistor form a third delay, the third NMOS transistor having a gate oxide thicker than gate oxide of the third PMOS transistor.

In another exemplary embodiment of the present invention, the circuit is a power switch including a plurality of transistors having different gate oxide thicknesses.

Additional features and advantages of the invention will be more fully apparent from the following detailed description of the exemplary embodiments. Various changes and modification within the spirit and scope of the invention will become apparent to those skilled in the art from this detailed description.

BRIEF DESCRIPTION OF THE DRAWINGS

The above and other features of exemplary embodiment of the present invention will become readily apparent by from the description of the exemplary embodiments that follows, with reference to the attached drawing in which.

DETAILED DESCRIPTION OF EXEMPLARY EMBODIMENTS OF THE INVENTION

Hereinafter, exemplary embodiments of the present invention will be described in detail with reference to the accompanied drawings.

Figure 1:
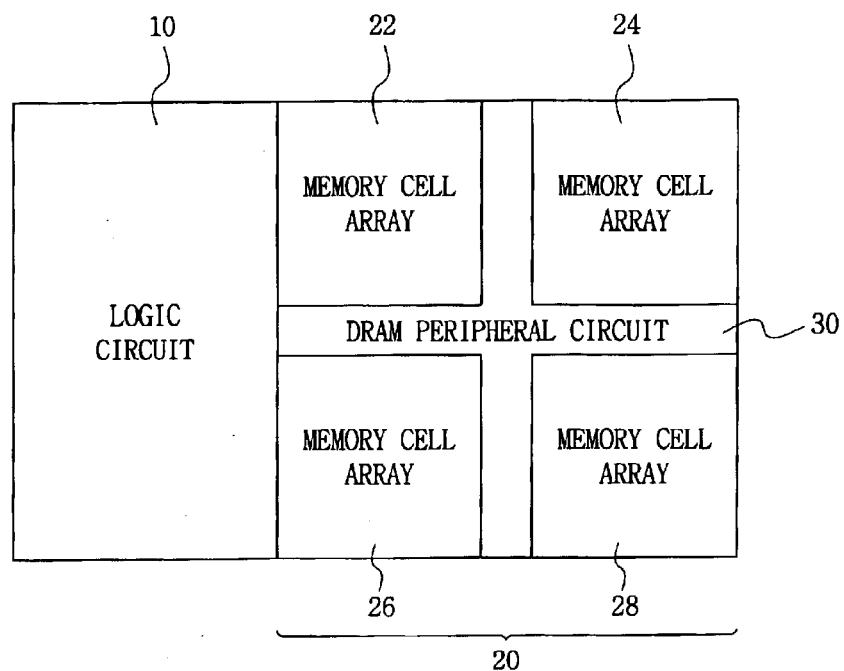
FIG. 1 illustrates a semiconductor memory device according to an exemplary embodiment.

FIG. 1 illustrates a semiconductor memory device according to an exemplary embodiment. The semiconductor memory device comprises a logic circuit 10 for performing an operational process, and a memory circuit 20 for storing data to be used in the logic circuit 10.

The memory circuit 20 includes memory cell arrays 22, 24, 26, 28 having a plurality of DRAM memory cells respectively arrayed in matrix, and a DRAM peripheral circuit 30 disposed in a center region of a crossed shape between the memory cell arrays 22, 24, 26, 28. The DRAM peripheral circuit 30 includes a circuit for performing an access operation of the memory cell arrays 22, 24, 26, 28, and a data transmission operation between the logic circuit 10 and the memory cell arrays 22, 24, 26, 28; and an internal voltage generating circuit for generating an internal voltage.

The DRAM peripheral circuit 30 includes at least a delay chain, a directional delay, and a power switch.

Figure 2:
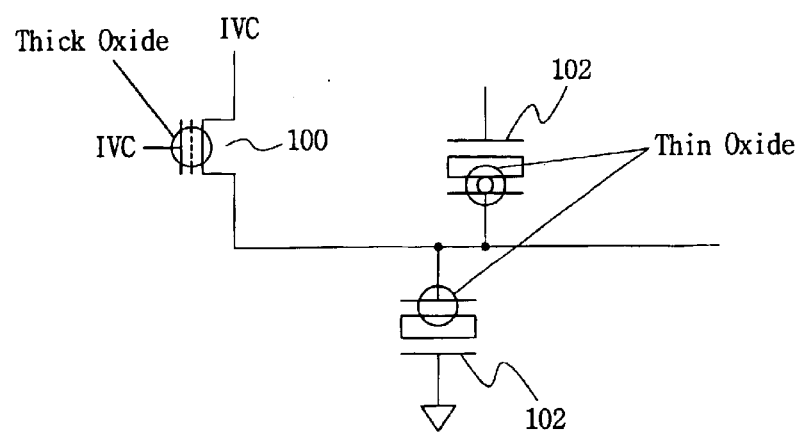
FIG. 2 illustrates a delay chain according to an exemplary embodiment of the present invention.

FIG. 2 illustrates a delay chain which delays a signal according to an exemplary embodiment of the present invention.

The delay chain includes a MOS transistor 100 driven by a voltage level of first power IVC, and a plurality of MOS capacitors 102 driven by an output signal of the MOS transistor 100, for storing data. The plurality of MOS capacitors 102 may be any combination of N type and a P type. The gate oxide of MOS transistor 100 is formed thicker than the gate oxides of the plurality of MOS capacitors 102 so as to reduce a flow of current and lengthen the delay time. The thinner the gate oxide of the MOS capacitors 102 is, the more the capacitance is.

Therefore, the delay time can be controlled by adjusting the thickness of the gate oxides of the MOS transistor 100 and the plurality of MOS capacitors 102.

Figure 3:
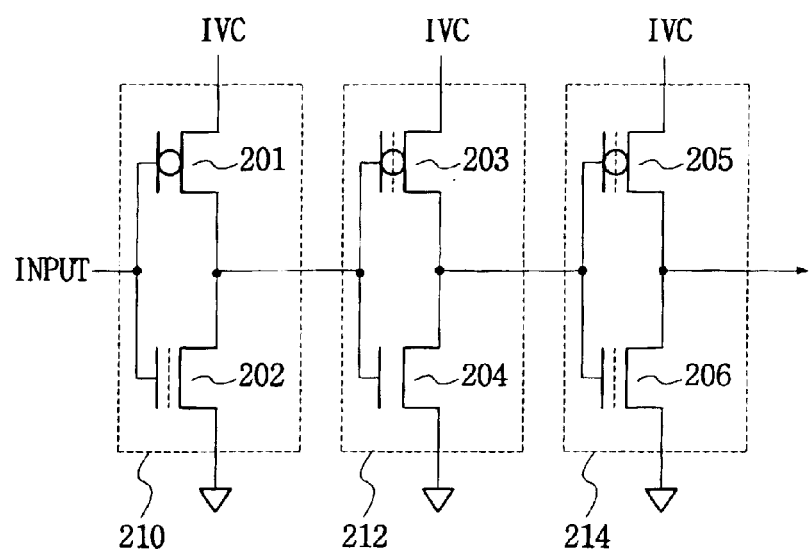
FIG. 3 illustrates a directional delay according to an exemplary embodiment of the invention.

FIG. 3 illustrates a directional delay according to an exemplary embodiment of the present invention.

The directional delay includes a first delay 210, a second delay 212 and a third delay 214 connected in series. The first delay includes a PMOS transistor 201 and a NMOS transistor 202. The gates of the two transistors 201, 202 are connected together to form an input terminal INPUT while the drains of the two transistors 201, 202 are connected together to form an output terminal. The source of the PMOS transistor 201 is connected to a voltage source IVC and the source of the NMOS transistor 202 is connected to the ground. The second delay 212 and the third delay 214 have structure similar to the first delay 210. The delays 210, 212, 214 are connected in series, that is, the output terminal of the first delay 210 is connected to the input terminal of the second delay 212 and the output terminal of the second delay 212 is connected to the input terminal of the third delay 214.

In the first delay 210, the gate oxide of the NMOS transistor 202 is formed thicker than a gate oxide of the PMOS transistor 201. In the second delay 212, the gate oxide of the PMOS transistor 203 is formed thicker than the gate oxide of the NMOS transistor 204. In the third delay 214, the gate oxide of the NMOS transistor 206 is formed thicker than the gate oxide of the PMOS transistor 205.

In the NMOS transistors 202, 206 and the PMOS transistor 203, when the gate oxides become thicker, a current flow is reduced and a delay time is lengthened; and when the gate oxides become thinner, the current flow is increased and the delay time is shortened.

If a signal input to the input terminal INPUT is high, the NMOS transistors 202, 206 and the PMOS transistor 203 are turned on. The delay time of the input signal is determined by the thickness of the gate oxides of the NMOS transistors 202, 206 and the PMOS transistor 203.

If the signal input to the input terminal INPUT is low, the PMOS transistors 201, 205 and the NMOS transistor 204 are turned on. The delay time of the input signal is determined by the thickness of the gate oxides of the PMOS transistors 201, 205 and the NMOS transistor 204.

Figure 4:
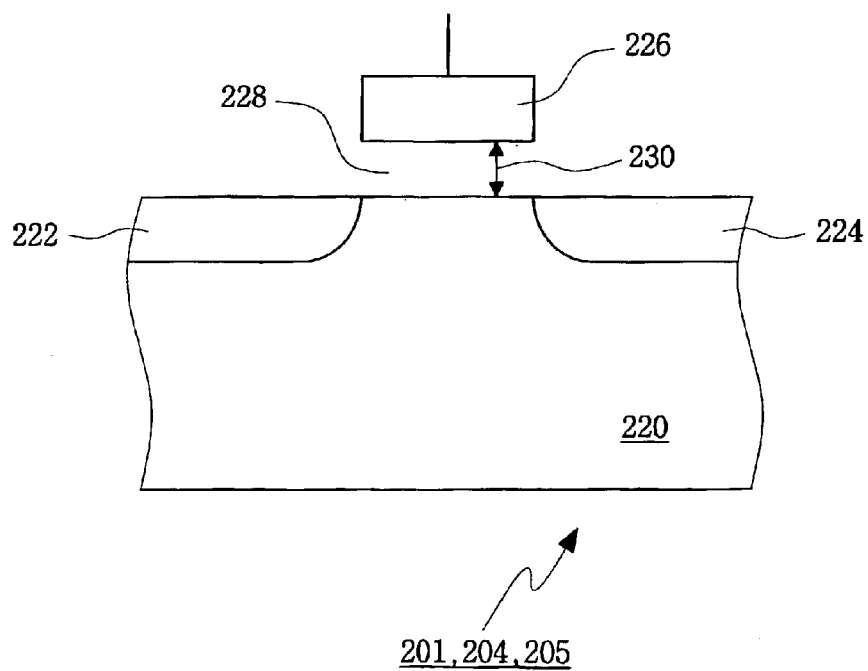
FIG. 4 illustrates a thin MOS transistor in a directional delay according to an exemplary embodiment of the invention.

FIG. 4 illustrates a thin gate oxide MOS transistor in a directional delay according to an exemplary embodiment of the invention. MOS transistors 201, 204 and 205 of FIG. 3 are examples of such thin gate oxide MOS transistors.

Referring to FIG. 4, the thickness 230 of the gate oxide 228 formed on a channel region between high concentration impurity regions 222, 224 is thin enough to obtain a sufficiently-small absolute value of a threshold voltage of the MOS transistor.

Figure 5:
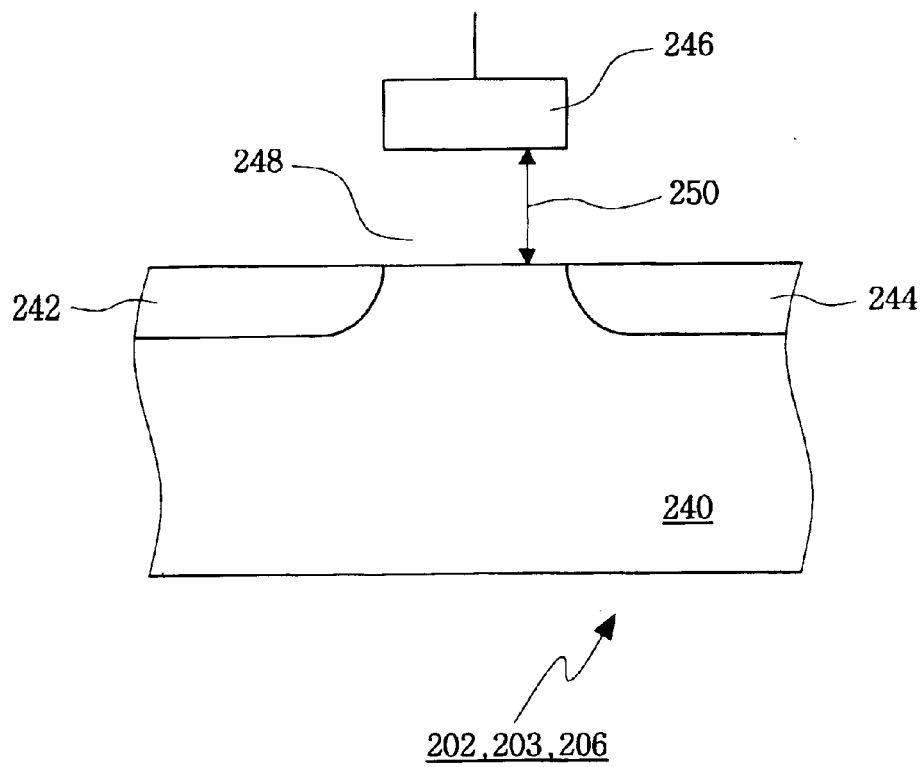
FIG. 5 illustrates a thick MOS transistor in a directional delay according to an exemplary embodiment of the invention.

FIG. 5 illustrates a thick gate oxide MOS transistor in a directional delay according to an exemplary embodiment of the invention. MOS transistors 202, 203 and 206 of FIG. 3 are examples of such thick gate oxide MOS transistors.

Referring to FIG. 5, the thickness 250 of gate oxide 248 formed on the channel region between high concentration impurity regions 242, 244, is thick enough to obtain a sufficiently-large absolute value of a threshold voltage of the MOS transistor.

Thus, the gate oxide 248 of the MOS transistor shown in FIG. 5 is formed thicker than the gate oxide 228 of the MOS transistor shown in FIG. 4. For example, a thickness of the gate oxide 228 of the MOS transistor shown in FIG. 4 is 40 Å and a thickness 250 of the gate oxide 248 of the MOS transistor shown in FIG. 5 is 80 Å.

The thickness of the gate oxides of the NMOS transistors 202, 206 and the PMOS transistor 203 is formed thicker than thickness of the gate oxides of the NMOS transistors 204 and the PMOS transistors 201, 205, so as to control the delay time.

Figure 6:
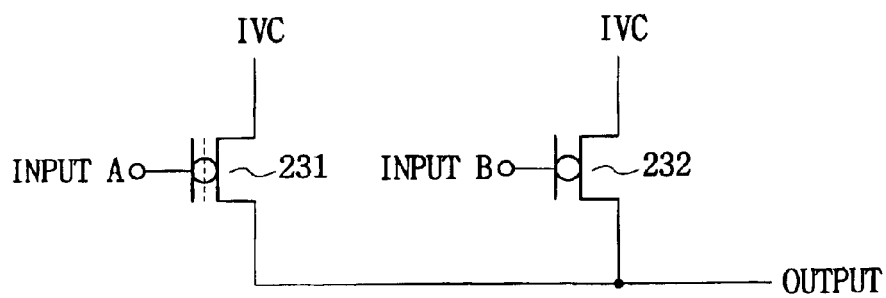
FIG. 6 illustrates a power switch according to an exemplary embodiment of the present invention.

FIG. 6 illustrates a power switch according to an exemplary embodiment of the present invention.

The power switch is constructed of PMOS transistors 231, 232 for respectively supplying the same source power IVC in response to power supply control signals individually applied through input terminals INPUT A and INPUT B.

The gate oxide of the PMOS transistor 231 is formed thicker than the gate oxide of the PMOS transistor 232. Thus, the PMOS transistor 231 has a reduction in a flow of current than the PMOS transistor 232. For example, for power of 1000 mA, a power of 800 mA is supplied to the PMOS transistor 231 and power of 200 mA is supplied to the PMOS transistor 232. When a power of only 200 mA is supplied, the PMOS transistor 232 is switched on to supply power. When a power of 800 mA is supplied, the PMOS transistor 231 is switched on to supply power. At this time, power is supplied on the basis of a capacitance of current; thus current consumption can be reduced. In addition, the power switch may be embodied as a transistor having a small capacitance, therefore a size of the MOS transistor and a layout area can be lessened.

As mentioned above, exemplary embodiments of the present invention make it possible to reduce the size of a semiconductor memory device. Gate oxides of transistors have different thickness within a circuit using the same voltage source, thereby making it possible to control the delay time, and a size of a MOS transistor and a layout area can be reduced.

Exemplary embodiments of the present invention make it possible to construct a delay chain that is constructed of a MOS transistor and a MOS capacitor using the same voltage source, a thickness of gate oxides of the MOS transistor and the MOS capacitor may be different. Therefore, an effect of the delay chain can be enhanced.

Exemplary embodiments of the present invention make it possible to construct a directional delay that is constructed of a plurality of transistors having different gate oxide thicknesses. The thicknesses control the delay time.

Exemplary embodiments of the present invention make it possible to construct a power switch using the same voltage source, a thickness of gate oxides in a plurality of MOS transistors is different from each other, so as to selectively supply power according to a capacitance of current. Accordingly, a size of the MOS transistor and a layout area can be reduced.

Although the present invention was described in detail above in connection with the exemplary embodiments thereof, the scope of the invention is not so limited. Various changes and modifications may be made without departing from the spirit and scope of the invention as defined in the following claims.

What is claimed is:

1. A peripheral circuit of a semiconductor device, comprising;
   a delay chain including a MOS transistor and a plurality of MOS capacitors that are connected to an output of the MOS transistor,
   wherein a gate oxide of the MOS transistor and gate oxides of the plurality of MOS capacitors have different thicknesses for controlling a delay time.

2. The peripheral circuit of claim 1, wherein the MOS transistor is driven by a first power and the plurality of MOS capacitors are driven by an output signal of the MOS transistor, the gate oxide of the MOS transistor being thicker than gate oxides of the plurality of MOS capacitors.

* * * * *